United States Patent [19]
Shima et al.

[11] 4,354,124
[45] Oct. 12, 1982

[54] DIGITAL PHASE COMPARATOR CIRCUIT

[75] Inventors: Takeshi Shima, Sagamihara; Ken-ichi Torii, Yokohama, both of Japan

[73] Assignee: Tokyo Shibaura Denki Kabushiki Kaisha, Kawasaki, Japan

[21] Appl. No.: 158,310

[22] Filed: Jun. 10, 1980

[30] Foreign Application Priority Data

Jun. 19, 1979 [JP] Japan .................. 54-76265

[51] Int. Cl.³ .................. H03K 13/32; H03K 5/26
[52] U.S. Cl. .................. 307/522; 307/514; 328/133; 328/165
[58] Field of Search .................. 328/133, 134, 165; 307/514, 516, 520

[56] References Cited
U.S. PATENT DOCUMENTS 3,588,710  6/1971  Masters .................. 328/133
3,610,954 10/1971  Treadway .................. 328/133 X
3,755,747  8/1973  Letosky .................. 328/133
4,090,143  5/1978  Merrell .................. 328/134

OTHER PUBLICATIONS

IEEE Transactions on Consumer Electronics, vol. CE-24, No. 1, Feb. 1978, pp. 24-33, "A New Design Technique for Digital PLL Synthesizers", by Eric Breeze.

*Primary Examiner*—John S. Heyman
*Attorney, Agent, or Firm*—Oblon, Fisher, Spivak, McClelland & Maier

[57] ABSTRACT

A digital phase comparator circuit comprises a digital phase comparator having output terminals and a circuit connected to the output terminals of the phase comparator and arranged to remove undesired pulse output signals simultaneously appearing at the output terminals due to propagation delay times of logic gates incorporated in the phase comparator.

4 Claims, 9 Drawing Figures

DIGITAL PHASE COMPARATOR CIRCUIT

This invention relates to a digital phase comparator circuit.

Recently, PLL (phase-locked loop) frequency synthesizers are used in various fields. The PLL frequency synthesizer basically comprises a voltage-controlled oscillator (VCO), a programmable counter for dividing the output frequency of the VCO by a factor of N, a digital frequency/phase comparator for comparing the output signal of the programmable counter with a reference signal in frequency and phase, and a charge pump-/lowpass filter responsive to the frequency/phase comparator to apply an analog control voltage to the VCO for control of the oscillation frequency thereof.

The digital frequency/phase comparator comprises a first input terminal receiving an output signal or variable frequency signal from the programmable counter, a second input terminal receiving a reference frequency signal, first and second output terminals, and a plurality of logic gates connected between the first and second input terminals on one hand and the first and second output terminals on the other hand. The logic gates are interconnected such that, when the phase of the variable frequency signal is leading the phase of the reference frequency signal, a pulse output signal (leading phase signal) indicating the phase difference between these two input signals is produced at the first output terminal, when the variable frequency signal is lagging in phase behind the reference frequency signal, a pulse output signal (lagging phase signal) is produced at the second output terminal, and, when the two input signals are in phase, the first and second output terminals are held at a predetermined voltage level.

The charge pump is driven by the frequency/phase comparator. When there is a phase difference between the two input signals applied to the frequency/phase comparator, it assumes a low level or high level output state for increasing or decreasing an output voltage of the lowpass filter. When the two input signals are in phase, it takes a high impedance output state to hold the output voltage of the lowpass filter.

Since the frequency synthesizer deals with a high frequency signal, it is a common practice to use, where it is given an IC form, a digital IC of rapid operation speed. However, the digital IC requires a greater chip area and dissipates a larger electric power. It can be therefore contemplated that even in the frequency synthesizer, the phase comparator circuit requiring no rapid operation speed is constituted by MOS transistors or I²L gates whose operation speed is slow.

When the digital phase comparator is constituted by MOS transistor gates or integrated-injection logic (I²L) gates, there will occur a problem that erroneous output signals are produced due to a propagation delay of each logic gate. More specifically, with the MOS or I²L gate phase comparator the leading phase and lagging phase signals will be simultaneously produced at the first and second output terminals during a state transition period. In case where the leading and lagging phase signals are simultaneously applied to the charge pump, the output voltage of the lowpass filter will be fluctuated to deteriorate a spectral output of the VCO. The deterioration of the spectral output of the VCO increases noises.

It is an object of the invention to provide a digital phase comparator circuit using logic gates, which is arranged to remove transient undesired pulse signals that simultaneously appear at two output terminals due to a propagation delay time of each of the logic gates.

The above object of the invention is achieved by connecting to first and second output terminals of a digital phase comparator, an erroneous pulse removing circuit means for removing erroneous output pulse signals which simultaneously appear at the first and second output terminals during a transition period of internal state of the phase comparator due to the propagation delay times of logic gates incorporated in the digital phase comparator. Specifically, the erroneous pulse removing circuit includes a first gate means, which produces a logical product of a first output signal at the first output terminal and an inversion signal of a second output signal at the second output terminal, and a second gate means, which produces a logical product of the second output signal and an inversion signal of the first output signal. Output signals of the phase comparator circuit that are free from undesired pulses are provided by the first and second gate means.

This invention can be more fully understood from the following detailed description when taken in conjunction with the accompanying drawings, in which.

Figure 1:
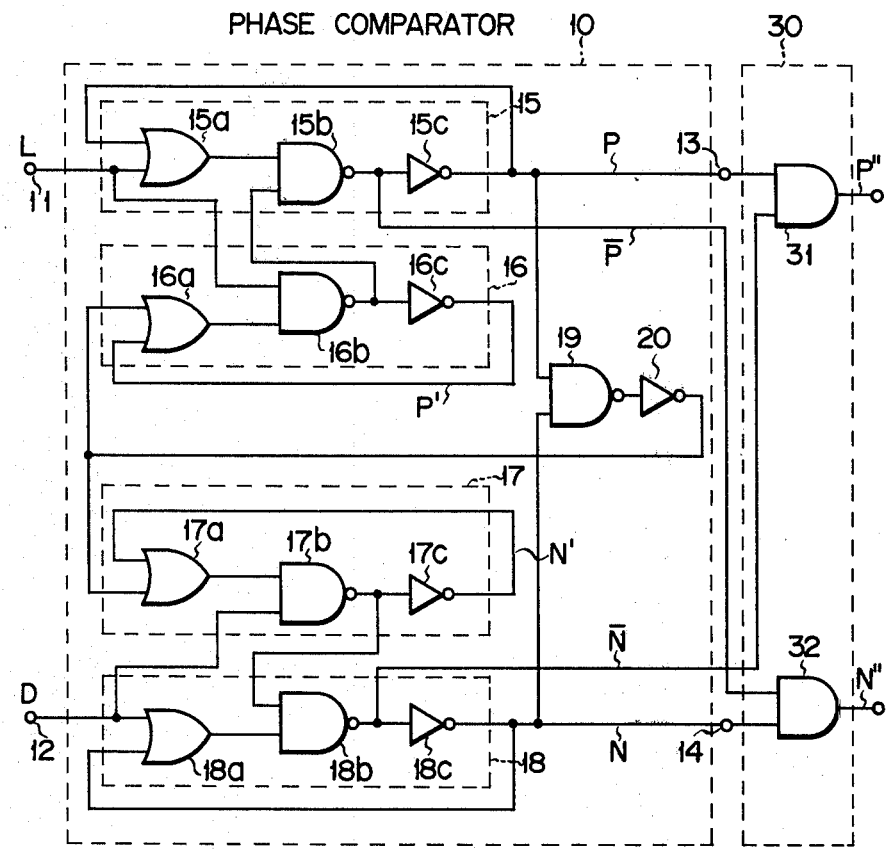
FIG. 1 is a logic circuit diagram of a digital phase comparator circuit according to an embodiment of the invention.

A phase comparator circuit embodying the invention and shown in FIG. 1 is comprised of a conventional digital phase comparator 10 and an erroneous pulse removing circuit 30. The phase comparator 10 includes an input terminal 11, to which an input signal L is applied, an input terminal 12, to which an input signal D is applied, output terminals 13 and 14, and state holding circuits 15 to 18. The state holding circuits 15 to 18 are respectively comprised of an OR gate 15a, a NAND gate 15b and an inverter 15c; an OR gate 16a, a NAND gate 16b and an inverter 16c; an OR gate 17a, a NAND gate 17b and an inverter 17c; and an OR gate 18a, a NAND gate 18b and an inverter 18c. More specifically, the input terminal 11 is connected to one input terminal of OR gate 15a and also to one input terminal of NAND gate 16b. The output terminal of OR gate 15a is connected to one input terminal of NAND gate 15b the other input terminal of which is connected to the output terminal of NAND gate 16b. The output terminal of NAND gate 15b is connected to the input terminal of inverter 15c the output terminal of which is connected to the output terminal 13 of phase comparator 10 and the other input terminal of OR gate 15a. The other input terminal 12 of the phase comparator 10 is connected to one input terminal of OR gate 18a and also to one input terminal of NAND gate 17b. The output terminal of OR gate 18a is connected to one input terminal of NAND gate 18b the other input terminal of which is connected to the output terminal of NAND gate 17b. The output terminal of NAND gate 18b is connected to the input terminal of inverter 18c the output terminal of which is connected to the output terminal 14 of phase comparator 10 and the other input terminal of OR gate 18a. The output terminals 13 and 14 of phase comparator 10 are connected to respective input terminals of a NAND gate 19. The output terminal of NAND gate 19 is connected to the input terminal of an inverter gate 20, which has its output terminal connected to one input terminal of each of the OR gates 16a and 17a. The output terminals of OR gates 16a and 17a are connected to the respective other input terminals of NAND gates 16b and 17b. The output terminals of NAND gates 16b and 17b are respectively connected to the input terminals of inverters 16c and 17c the output terminals of which are respectively connected to input terminals of OR gates 16a and 17a.

The undesired pulse removing circuit 30 includes an AND gate 31, which has one input terminal connected to the output terminal 13 of phase comparator 10 and the other input terminal connected to the output terminal of NAND gate 18b, and an AND gate 32, which has one input terminal connected to the output terminal 14 of phase comparator 10 and the other input terminal connected to the output terminal of NAND gate 15b.

Figure 2:
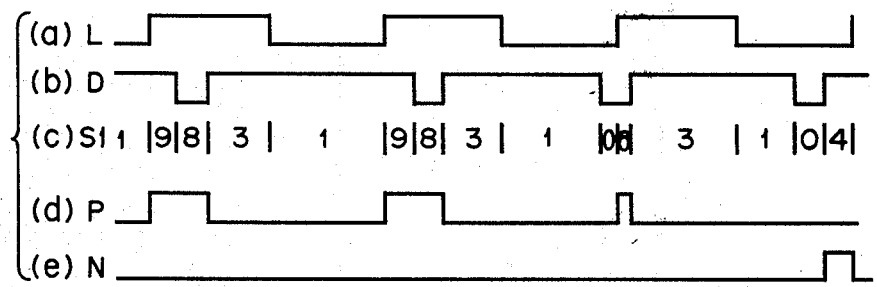
FIG. 2 is a time chart of the phase comparator shown in FIG. 1.
Figure 3:
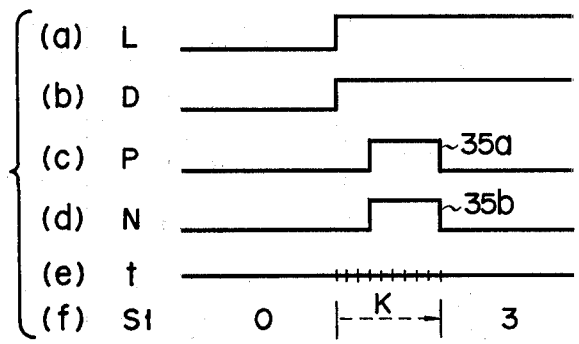
FIGS. 3 and 4 show transient responses of the phase comparator shown in FIG. 1.

The operation of the phase comparator 10 will now be described with reference to FIGS. 2 to 4. FIG. 2 is a time chart of the phase comparator 10. In the figure, $S_1$ represents one of the internal states of the phase comparator 10 which is expressed by as $$S_1 = P \times 2^3 + N \times 2^2 + P' \times 2^1 + N' \times 2^0$$

where P and N (either "1" or "0") are respectively the output signals at the output terminals 13 and 14, and P' and N' (either "1" or "0") are respectively the output signals of the inverters 16c and 17c. The internal state number of the phase comparator is shifted to a different state number with a change of the voltage level of either one of the input signals L and D. The state number that results after the shift depends upon the initial state number before the change of the signals L and D. It will be seen from the time chart of FIG. 2 that the phase comparator 10 shown in FIG. 1 detects a phase difference between the positive edges of the input pulse signals L and D.

Undesired pulses are liable to be produced during the transition period, during which the internal state number of the phase comparator is shifted from one to another with a change of the voltage level of the input signals L and/or D. For example, as shown in FIG. 3, when both the input signals L and D are simultaneously changed from a logic "0" level to a logic "1" level in an internal state represented by state number 0, erroneous pulses 35a and 35b are produced at the output terminals 13 and 14 of the phase comparator during the transition period until the state number is changed to 3 due to propagation delay times of the logic gates. It is now assumed that the OR gates, NAND gates and inverter gates used in the phase comparator 10 have the same propagation delay time.

With the simultaneous change of the input signals L and D to the high level, as shown in FIGS. 3(a) and 3(b), the output signals P and N are changed to the high level after a delay time corresponding to three times the propagation delay time of a single logic gate because of the cascade connections of the three logic gates 15a, 15b and 15c; and 18a, 18b and 18c. In the time axis t shown in FIG. 3(e), one graduation represents the propagation delay time of one logic gate. With the change of the output signals P and N to the high level, the output signals of the state holding circuits 16 and 17 are changed to the high level by means of a feedback loop comprised of the NAND gate 19 and inverter gate 20. With the change of the outputs of the NAND gates 16b and 17b, the output signals P and N are changed to the low level. The period of time required until the output signals P and N are returned to the low level after the change to the high level is equal to the sum of propagation delay times of six logic gates connected in cascade (for instance, the NAND gate 19, inverter 20, OR gate 16a, NAND gate 16b, NAND gate 15b and inverter 15c). This means that the phase comparator produces high level undesired pulses 35a and 35b simultaneously appearing at the respective output terminals 13 and 14 during the transition period k which is involved until a change of the internal state number from 0 to 3 is completed.

Figure 4:
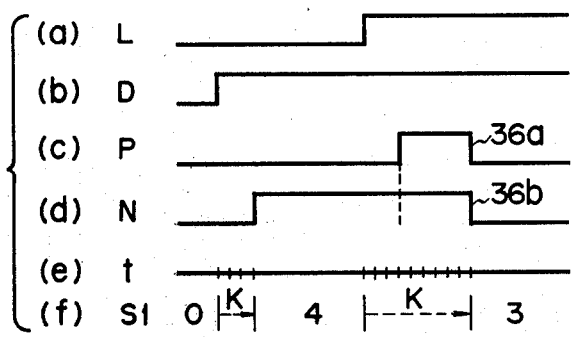

FIG. 4 shows a transient response of the phase comparator in case where there is a phase difference between the input signals L and D. Even in this case, the phase comparator produces undesired pulses 36a and 36b during the transition period involved until the completion of a change of its internal state number from 4 to 3.

Figure 5:
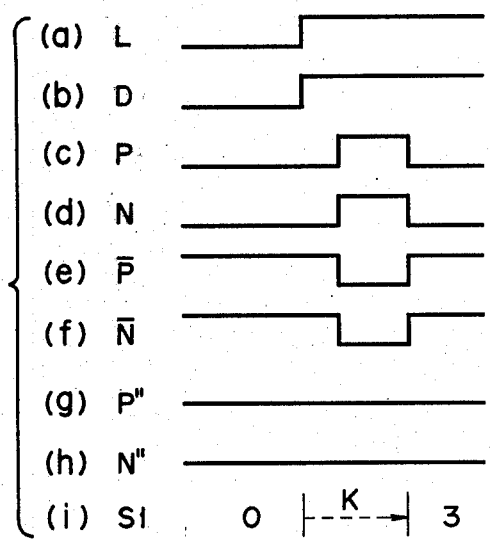
FIGS. 5 and 6 are time charts for explaining the operation of the phase comparator circuit of FIG. 1.

The erroneous pulse removing circuit 30 acts to prevent the undesired pulses that simultaneously appear at the output terminals 13 and 14 of the phase comparator 10 from being supplied to a charge pump. The operation of the erroneous pulse removing circuit 30 will now be described with reference to FIG. 5. As mentioned earlier, with the simultaneous change of the input signals L and D to the high level, as shown in FIGS. 5(a) and 5(b), both the output signals P and N of the phase comparator are erroneously changed to the high level, as shown in FIGS. 5(c) and 5(d). The AND gate 31 in the circuit 30 is connected to receive the output signal P and an inversion signal $\overline{N}$ (shown in FIG. 5(f)) of the output signal N, i.e., the input signal to the inverter 18c in the instant embodiment, while the AND gate 32 is connected to receive the output signal N and an inversion signal $\overline{P}$ (shown in FIG. 5(e)) of the output signal P, i.e., the input signal to the inverter 15c in this embodiment. Thus, the output signals P" and N" of the respective AND gates 31 and 32 are prevented from simultaneously assuming the high level during the transition period k, as shown in FIGS. 5(g) and 5(h).

Figure 6:
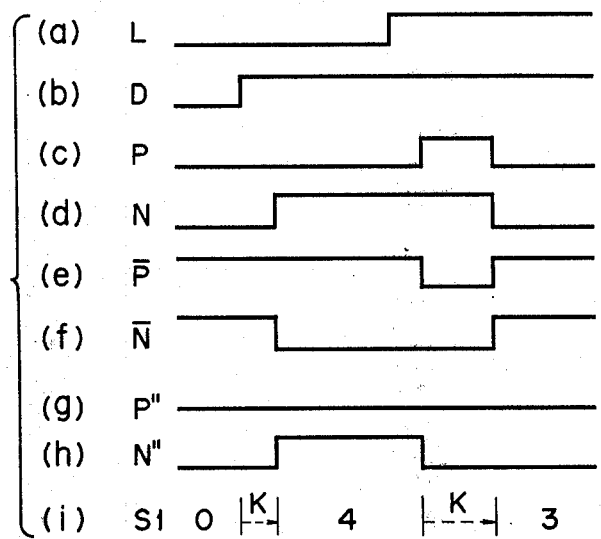

In case when there is a phase difference between the input signals L and D as shown in FIG. 4, the output signals P" and N" of the AND gates 31 and 32 are prevented from simultaneously assuming the high level during the transition period k of the change of the internal state number from 4 to 3, as shown in FIG. 6.

It is to be appreciated that the phase comparator circuit shown in FIG. 1, which detects the phase difference between the positive edges of the two input waveforms, is thus arranged such that it will not simultaneously supply high level erroneous pulse outputs to the charge pump. Besides, since the erroneous pulse removing circuit 30 does not influence the change of the internal state of the phase comparator 30 at all, the function of the phase comparator does not change. Thus, it is possible to use elements having large propagation delay times such as MOS devices and I²L gates without deteriorating the VCO spectrum. In addition, it is possible to construct a phase comparator circuit, which consumes low power and occupies a small chip area.

Figure 7:
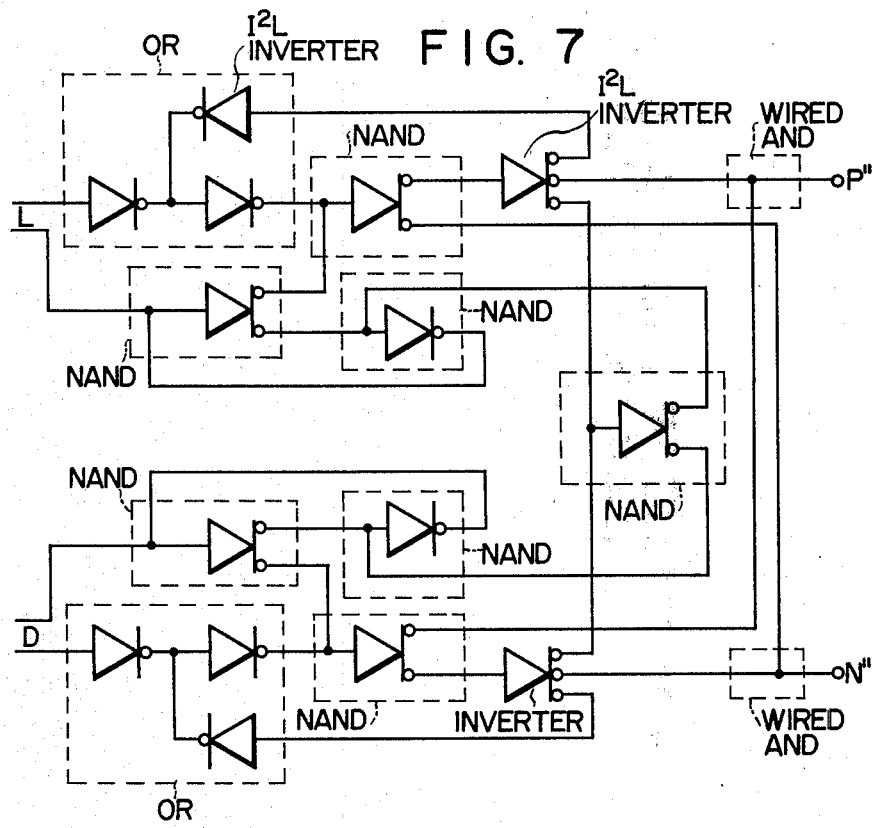
FIG. 7 shows a phase comparator circuit using I²L gates which corresponds to the comparator circuit of FIG. 1.

FIG. 7 shows a phase comparator circuit constructed by using I²L gates having a relatively great propagation delay time on the basis of the circuit of FIG. 1. Also, each of the AND gates in the erroneous pulse removing circuit is constituted by a wired AND.

Figure 8:
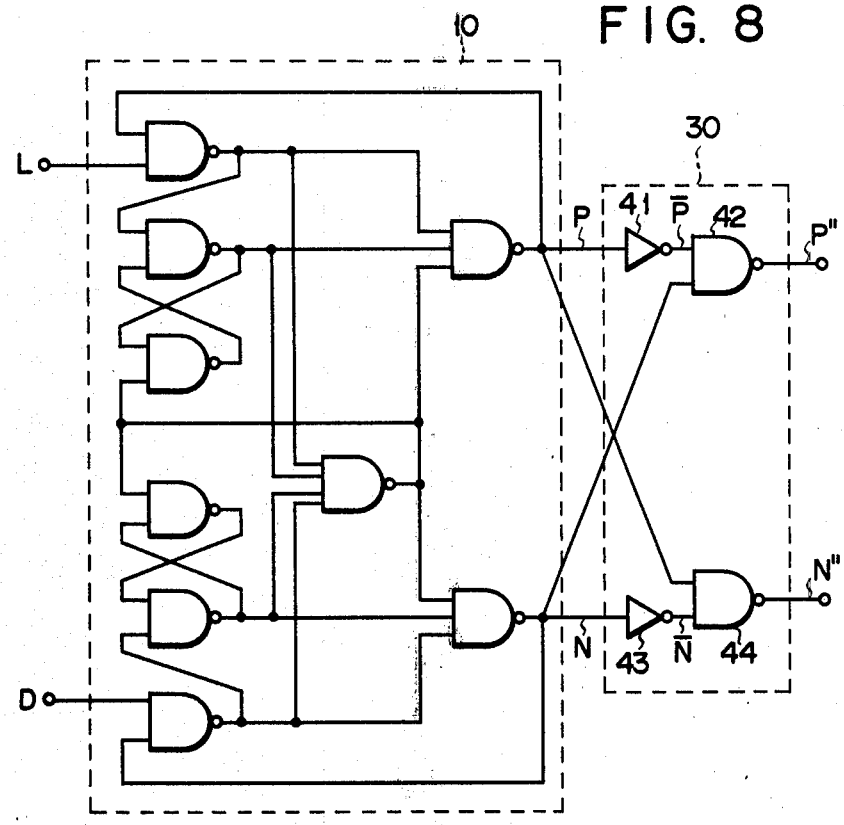
FIG. 8 shows a digital phase comparator circuit according to another embodiment of the invention.

FIG. 8 shows another embodiment of the phase comparator circuit. In this embodiment, Motorola MC4044 phase comparator which is so arranged as to detect a phase difference between the negative edges of the input waveforms L and D is used as the phase comparator 10. The erroneous pulse removing circuit 30 here is provided for preventing the output signals P and N of the phase comparator 10 from simultaneously assuming the low level, and includes an inverter gate 41 receiving the output signal P, a NAND gate 42 receiving the output signal $\overline{P}$ of the inverter gate 41 and the output signal N, an inverter gate 43 receiving the output signal N and a NAND gate 44 receiving the output signal $\overline{N}$ of the inverter gate 43 and the output signal P.

Figure 9:
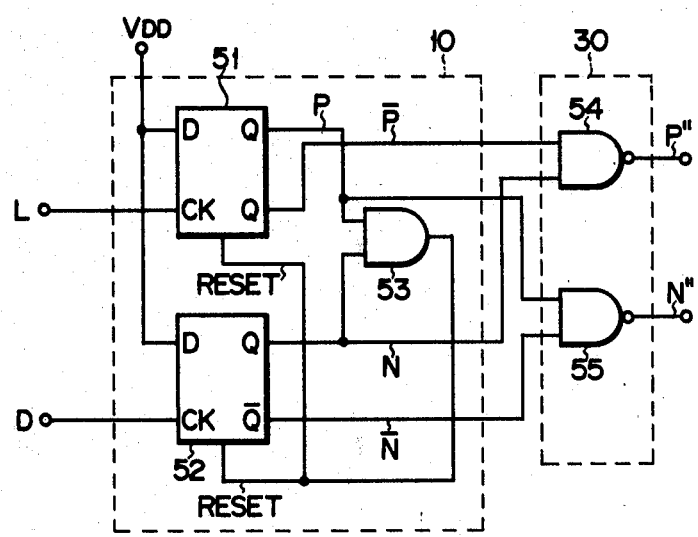
FIG. 9 shows a digital phase comparator according to still another embodiment of the invention.

FIG. 9 shows still another embodiment of the phase comparator circuit. In this embodiment, the phase comparator 10 includes D-type flip-flop circuits 51 and 52 and an AND gate 53 receiving the output signals P and N provided from the Q output terminals of the resepective flip-flop circuits 51 and 52 and having an output terminal connected to the reset terminal of each of the flip-flops 51 and 52, and the erroneous pulse removing circuit 30 includes a NAND gate 54, which receives the output signal $\overline{P}$ from the $\overline{Q}$ output terminal of the flip-flop circuit 51 and the output signal N from the Q output terminal of the flip-flop circuit 52 and produces the output signal P", and a NAND gate 55, which receives the output signal P from the Q output terminal of the flip-flop circuit 52 and the output signal $\overline{N}$ from the $\overline{Q}$ output terminal of the flip-flop circuit 52 and produces the output signal N".

What we claim is:
1. A digital phase comparator circuit comprising:
a digital phase comparator including first and second input terminals, first and second output terminals and a plurality of logic gates having a propagation delay time and interconnected between said first and second input terminals on one hand and said first and second output terminals on the other hand, said phase comparator being so arranged as to produce, when there is a phase difference between the waveforms of input signals applied to said first and second input terminals, an output pulse signal corresponding to said phase difference at either one of said first and second output terminals; and
an undesired pulse removing circuit connected to said first and second output terminals of said phase comparator for removing undesired pulse output signals simultaneously produced at said first and second output terminals during a transition period of internal state of said phase comparator due to the propagation delay times of said logic gates included in said phase comparator and including a first gate means receiving an output signal at said first output terminal and an inversion signal of an output signal at said second output terminal, and a second gate means receiving the output signal at said second output terminal and an inversion signal of the output signal at said first output terminal.

2. The digital phase comparator circuit according to claim 1, wherein each of said first and second gate means includes an AND gate.

3. The digital phase comparator circuit according to claim 1, wherein each of said first and second gate means includes a NAND gate.

4. The digital phase comparator according to claim 1, wherein said logic gates are integrated-injection logic gates.

* * * * *